United States Patent [19]

Reid

[11] Patent Number: 4,572,886
[45] Date of Patent: Feb. 25, 1986

[54] OPTICAL METHOD FOR INTEGRATED CIRCUIT BAR IDENTIFICATION

[75] Inventor: Lee R. Reid, Plano, Tex.

[73] Assignee: Texas Instruments Incorporated, Dallas, Tex.

[21] Appl. No.: 548,545

[22] Filed: Nov. 3, 1983

[51] Int. Cl.[4] .......................... G03C 5/36; H01L 21/66
[52] U.S. Cl. ..................................... 430/152; 430/22; 430/292; 430/311; 430/945; 427/53.1; 427/8
[58] Field of Search ................ 430/152, 292, 311, 22, 430/DIG. 945

[56] References Cited

U.S. PATENT DOCUMENTS

| | | | |
|---|---|---|---|
| 3,492,072 | 1/1970 | Haun | 430/311 X |
| 3,536,407 | 10/1970 | Sandlin | 356/430 |
| 3,669,658 | 6/1972 | Yonezawa et al. | 430/292 X |
| 4,139,853 | 2/1979 | Ghekiere et al. | 430/281 X |
| 4,225,661 | 9/1980 | Muzyczko | 430/292 X |
| 4,241,165 | 12/1980 | Hughes et al. | 430/292 X |
| 4,297,435 | 10/1981 | Jolly et al. | 430/292 X |
| 4,348,803 | 9/1982 | Sasaki | 427/10 |
| 4,400,461 | 8/1983 | Chandross et al. | 430/311 |
| 4,425,424 | 1/1984 | Altland et al. | 430/292 X |
| 4,522,656 | 6/1985 | Kuhn-Kuhnenfeld et al. | 156/644 |

FOREIGN PATENT DOCUMENTS

| | | | |
|---|---|---|---|
| 0068801 | 1/1983 | European Pat. Off. | 430/945 |
| 0021330 | 2/1983 | Japan | 430/22 |

*Primary Examiner*—John E. Kittle
*Assistant Examiner*—Mukund J. Shah
*Attorney, Agent, or Firm*—Richard A. Bachand; N. Rhys Merrett; Melvin Sharp

[57] ABSTRACT

A method for optically marking selected integrated circuit bars of visual identification. In one embodiment a layer for photosensitive material applied to a portion of all of the bars on a wafer prior to testing. Selected bars are marked by directing a beam of radiant energy at the photosensitive material, which changes opacity and/or color in the irradiated region.

5 Claims, 3 Drawing Figures

OPTICAL METHOD FOR INTEGRATED CIRCUIT BAR IDENTIFICATION

BACKGROUND OF THE INVENTION

This invention relates generally to semiconductor device fabrication and more particularly to an improved method for selectively identifying or marking semiconductor integrated circuit bars on a wafer.

In the fabrication of semiconductor devices each integrated circuit bar on a wafer is tested prior to scribing and breaking the wafer into individual bars for assembly and packaging. Various methods are known for identifying which bars failed the test and thus should be scrapped. A commonly used method is to apply an ink dot to the defective bars by means of a thin cord of nylon or similar material attached to the plunger of an electrical solenoid. The end of the cord is in a reservoir of ink. When activated the solenoid pushes the cord out through a hollow tube, carrying with it a small amount of ink, and the inked cord touches the surface of the integrated circuit bar.

While this method effectively marks the bars, it has the disadvantages of using a liquid, i.e., the ink tends to splatter and run. Further, the inking apparatus is typically bulky and unreliable and the ink reservoir requires frequent cleaning and refilling.

SUMMARY OF THE INVENTION

The present invention overcomes these and other disadvantages by providing a method of optically marking selected bars for visual identification.

According to one embodiment of the present invention a relatively thick layer of optical radiation sensitive material is applied to a portion of the surface of all of the bars on a wafer prior to testing. When a defective bar is encountered during multiprobe testing, a beam of radiant energy is directed through the optical system of the tester and impinges on the sensitive layer, causing the irradiated region to change in opacity and/or color, depending upon the optical characteristics of the selected material. The defective bar is thus easily identified by visual inspection.

It is therefore an object of the present invention to provide an improved method of marking semiconductor integrated circuit devices.

Another object is to provide an optical method for selectively marking semiconductor bars.

Yet another object is to provide a high speed marking technique that is compatible with conventional semiconductor fabrication processes.

BRIEF DESCRIPTION OF THE DRAWINGS

Other objects and many of the attendant advantages of the present invention will become apparent, and the invention will be better understood by reference to the following detailed description with the accompanying drawings, wherein.

DETAILED DESCRIPTION OF THE PREFERRED EMBODIMENT

Figure 1:
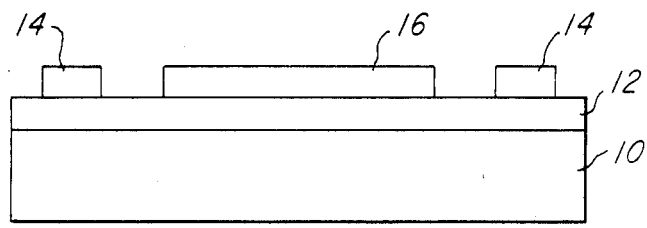
FIG. 1 is a cross-sectional view of a semiconductor integrated circuit bar.
Figure 2:
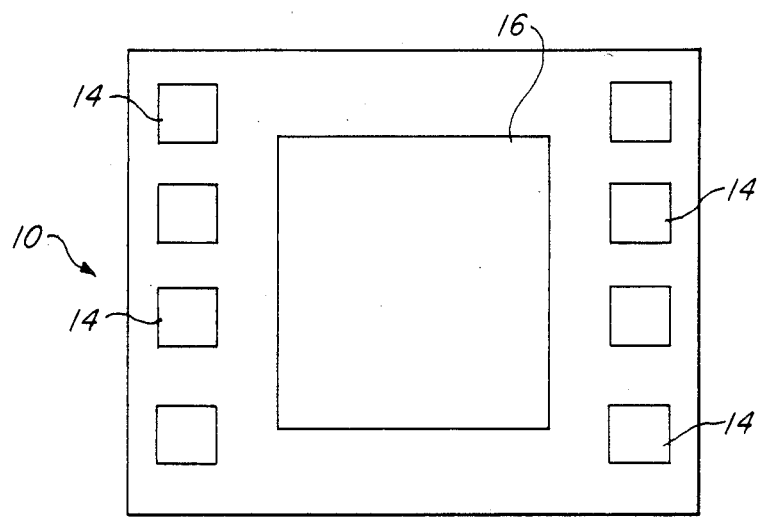
FIG. 2 is a top plan view of the bar of FIG. 1.

Referring now to the drawings, there is shown in FIG. 1 a cross-sectional view of a portion of one of a plurality of integrated circuit devices 10 having a passivation layer 12, for example, silicon oxide or silicon nitride, formed thereon. A plurality of conductive bond pads 14, for example aluminum contacts, are formed on layer 12. For clarity of illustration, the underlying active regions of a bar 10 have been omitted. Each bar 10 on a wafer has a photosensitive region 16 formed thereon by conventional masking techniques. Region 16, which may have any desired shape, is formed on layer 12 spaced apart from bond pads 14. Referring to FIG. 2, region 16 is shown as a rectangular region.

Figure 3:
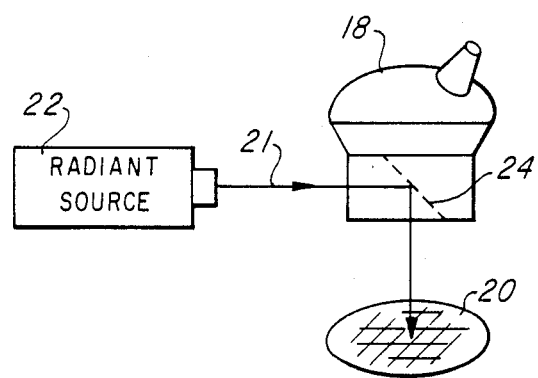
FIG. 3 is a diagrammatic view of a portion of a wafer in a multiprobe tester including an optical system according to the present invention.

There is shown in FIG. 3 a diagrammatic view of a portion of a multiprobe test system including an optical system 18 which is used by an operator for visual inspection of the wafers under test. The wafer 20 under test is positioned so that the bond pads 14 of a selected bar 10 are brought into contact with the test probes (not shown). If the bar passes the electrical test, wafer 20 is repositioned so that the test probes are brought into contact with the next bar to be tested. However, if the bar is defective, a beam of radiant energy 21 from source 22 is directed onto region 16 causing the irradiated portion of region 16 to change opacity and/or color. The beam from source 22 may conveniently be directed through optical system 18, for example, by means of a beam splitter 24 or similar optical device, and the radiant source 22 may be activated either manually or automatically by a logical signal from the test system.

One photosensitive material that has been found useful in practicing the present process is "Kalvar", which is a photoresistive compound commercially available from the Xidex Corp., New Orleans, La. In one example of the inventive process, which is given for illustrative purposes only and is not intended to be a limitation of the present invention, region 16 was formed to approximately a 1 mil thickness on layer 14 as shown in FIG. 1, and source 22 was a Xenon flash lamp. When a defective bar 10 was found, a beam from source 22 having a power density of about 200 mW-sec. per square cm. was directed at region 16, causing the irradiated portion to change in opacity from substantially clear to a white color. The defective bars 10 on wafer 20 were easily identifiable upon subsequent visual inspection. It will be apparent to those skilled in the art that other sources of optical radiation, for example ultraviolet, laser, and infrared, may be employed if the suitable photosensitive material is selected for region 16, that is, a material that changes its color and/or opacity upon exposure to the optical radiation. The present process is also useful in grading integrated circuit devices depending upon the test results. For example, a plurality of regions 16 can be formed on each bar and one or more regions can be irradiated depending on the grade of the device; or, a single region 16 may be irradiated in more than one location. Alternatively, the photosensitive material in region 16 can be chosen so that a desired color will appear upon exposure to the optical radiation.

Other embodiments and modifications of the present invention will readily come to those skilled in the art having the benefit of the foregoing description and drawings. It is therefore to be understood that such modifications and embodiments are intended to fall within the spirit and scope of the appended claims.

What is claimed is:

1. A method for marking selected semiconductor devices on a semiconductor wafer to distinguish said devices in accordance with test results obtained on said devices, comprising the steps of:

forming an optically sensitive layer upon said semiconductor devices to be selectively marked; and selectively exposing at least a portion of said layer associated with said devices selected in accordance with the test results to a source of radiation to alter the visual appearance of said layer in the irradiated portions.

2. The method of claim 1 wherein said source of radiation comprises a laser.

3. The method of claim 1 wherein said source of radiation comprises an ultraviolet light source.

4. The method of claim 1 wherein said source of radiation comprises a Xenon flash lamp.

5. The method of claim 1 wherein said optically sensitive layer is formed over the passivated portion of said semiconductor device.

* * * * *